United States Patent [19]

Barnes et al.

[11] Patent Number: 5,049,843
[45] Date of Patent: Sep. 17, 1991

[54] STRIP-LINE FOR PROPAGATING MICROWAVE ENERGY

[76] Inventors: Ramon M. Barnes, 109 Mt. Warner Rd., Hadley, Mass. 01036; Edward R. Reszke, c/o Technical Univ. of Wroclaw Dept. of Electronics (I-28) Wybrzeze Wyspianskiego 27, PL - 50-370 Wroclaw, Poland

[21] Appl. No.: 508,707

[22] Filed: Apr. 12, 1990

[51] Int. Cl.[5] .................. H01P 5/04; H01J 23/36
[52] U.S. Cl. ........................... 333/246; 315/39; 324/409; 333/263; 333/99 PL
[58] Field of Search ............. 333/13, 246, 99 PL; 315/39, 111.21; 324/409

[56] References Cited

U.S. PATENT DOCUMENTS

| | | | |
|---|---|---|---|
| 2,707,231 | 4/1955 | Townes | 333/13 X |
| 2,760,163 | 8/1956 | Arditi | 333/13 |
| 2,798,186 | 7/1957 | Caithness | 333/13 UX |
| 2,997,675 | 8/1961 | Anderson | 333/13 X |

Primary Examiner—Paul Gensler
Attorney, Agent, or Firm—Chapin, Neal & Dempsey

[57] ABSTRACT

A device for propagating microwave energy to a plasma discharge tube from an antenna coupled to a microwave generator includes a hollow rectangular conduit and a strip-line resonator or strip-line conductor disposed therein. The discharge tube is mounted perpendicular to and through a central opening in the strip-line resonator and is disposed at a distance, from one end of the strip-line where the antenna is located, of one-half the wavelength of the microwave energy and one-quarter wavelength from the opposite end. The strip-line is attached to one end of the rectangular conduit and is supported by a dielectric member at a point one-quarter wavelength from the antenna. Microwave energy is propagated from the antenna by the strip-line dimensioned to the resonant frequency of the microwave the energy. A gas, such as argon or helium, is introduced into the discharge tube and is ionized by microwave energy to form a plasma.

6 Claims, 2 Drawing Sheets

STRIP-LINE FOR PROPAGATING MICROWAVE ENERGY

BACKGROUND OF THE INVENTION

This invention relates to microwave propagating devices capable of efficient energy transfer from a microwave generator to an ionizable gas to form a plasma. More particularly, this invention, which can used with both low power and high power microwave energy, relates to a cavity which includes a strip-line resonator for providing energy coupling between an electromagnetic field and a gas adapted to form a plasma.

In the prior art, a variety of devices have been developed to generate plasmas for various applications. In high power applications, typically, only three types of such devices are employed. The first is generally known as a one-electrode plasma torch, the second is a plasmatron which uses a rectangular wave guide in combination with a quartz discharge tube, and the third employs a circular cavity having a discharge tube located along the axis of symmetry of the cavity.

In low-power applications, the following cavity configurations have been generally utilized:
(1) a three-quarter wavelength Fehsenfield cavity;
(2) one electrode coaxial plasmatron;
(3) Benakker cavity of a radial-type TEM mode, and
(4) surfatron type surface wave launcher.

These devices have been variously described in the following patent and publications:

Moisan, et al, U.S. Pat. No. 4,049,940 dated Sept. 20, 1977; Cobine, J. D., Wilbur, D. A., *JOURNAL OF APPLIED PHYSICS*, 22, 835 (1951); Zhukov, M. ed., *THEORY OF THE ELECTRIC ARC*, Norosibirsk 1977; Kapica, P., JETP, 57(6), 1801 (1969); Shogerbee, R. K. *ANAL. CHEM.* 48, 611A (1976); Laison, G. F., et al, *ANAL. CHEM.* 48, 1161 (1976); Boumans, P., de Boer, F. J., Holzel, H., Meier, A., *SPECTROCHIM. ACTA*, 30B, 449 (1975); Benakker, C. I. M., *SPECTROCHIMICA ACTA*, 31B, 483 (1976); 32B, 173 (1977); 33B, 53 (1978), and Moisan, M. C Beaudry and P. Leprince, *IEEE TRANS PLASMA SCIENCE*, PS-3, 55 (1975).

In all the devices referred to above, to avoid reflected power and achieve maximum energy transfer, additional tuning devices have been required. It has been found that when the devices of the prior art are used in the direct introduction or chromatography of gases and liquids, there is a tendency for any excess solvents present with the specimens being analyzed to extinguish the plasma.

Accordingly, it is the principal object of this invention to provide a microwave cavity of simple but efficient construction for the transfer of microwave energy to an ionizable gas to form a plasma.

It is a further object of this invention to provide an improved method of generating and maintaining a plasma adaptable for use in direct gas and liquid introduction and in gas and liquid chromatography.

The above and other objects and advantages of this invention will be more readily apparent from the following description read in conjunction with the accompanying drawings in which.

DETAILED DESCRIPTION OF THE INVENTION

Figure 1:
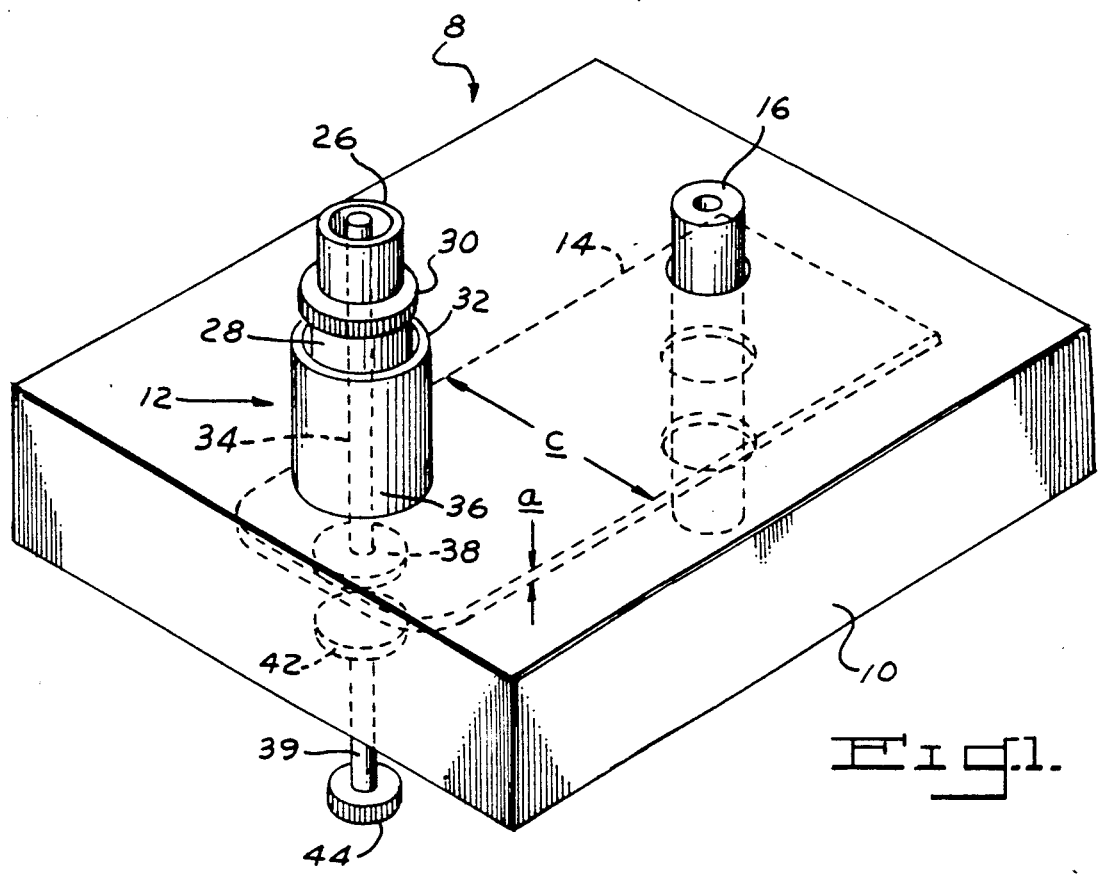
FIG. 1 is a perspective view of a cavity for propagating microwave energy of the type embodying this invention.

A microwave cavity, as shown generally at 8 in FIG. 1, comprises a rectangular conduit 10, a microwave energy coupling device 12, a strip-line 14 for propagating microwave energy within the cavity and a plasma discharge tube 16.

The rectangular conduit 10 takes the form of a hollow or tubular metallic shell in the nature of a wave guide constructed of an aluminum alloy. The conduit 10 provides a screen or barrier to confine microwave energy within the walls thereof. A microwave generator (not shown) develops energy which is fed by some suitable means, such as a coaxial cable to the coupling device 12 where it is propagated along strip-line 14 within the rectangular conduit 10 to the discharge tube 16.

The energy coupling device 12 is disposed adjacent one end of rectangular conduit 10 and includes an adjusting mechanism 30, an antenna portion 38, and a capacitive tuner 42. The adjusting mechanism comprises coaxial line connector 26 which is attached to one end of tubular member 28, the opposite end of which is threaded (not shown) on the outer lower edge portion. A second tubular member 32 is internally threaded and is dimensioned such that the position of member 28 may be adjusted by turning knob 30. The opposite end of tubular member 32 is mounted perpendicularly to the reectangular section 10.

The antenna portion includes conductor member 34 which is attached to connector 26 and is disposed axially through member 28, member 32 and aperture 36 of rectangular section 10. Antenna 38 is preferably a circular disc or plate, disposed perpendicularly to the terminal end of conductor 34. When tubular member 28 is rotated by knob 30 within member 32, the antenna 38 will be moved toward or away from the upper surface of strip-line 14, depending upon the direction of rotation.

The capacitive tuner 42, a circular disc or plate similar to antenna 38, is disposed on the opposite side of strip-line 14 from plate antenna 38 and is adjustable by rotation of a threaded rod 39 by means of knob 44. Rod 39 is disposed through a threaded bore (not shown) of conduit 10 and can be rotated by knob 44 in either direction to vary distance between the circular plate 42 and the undersurface of the strip-line 14.

Figure 2:
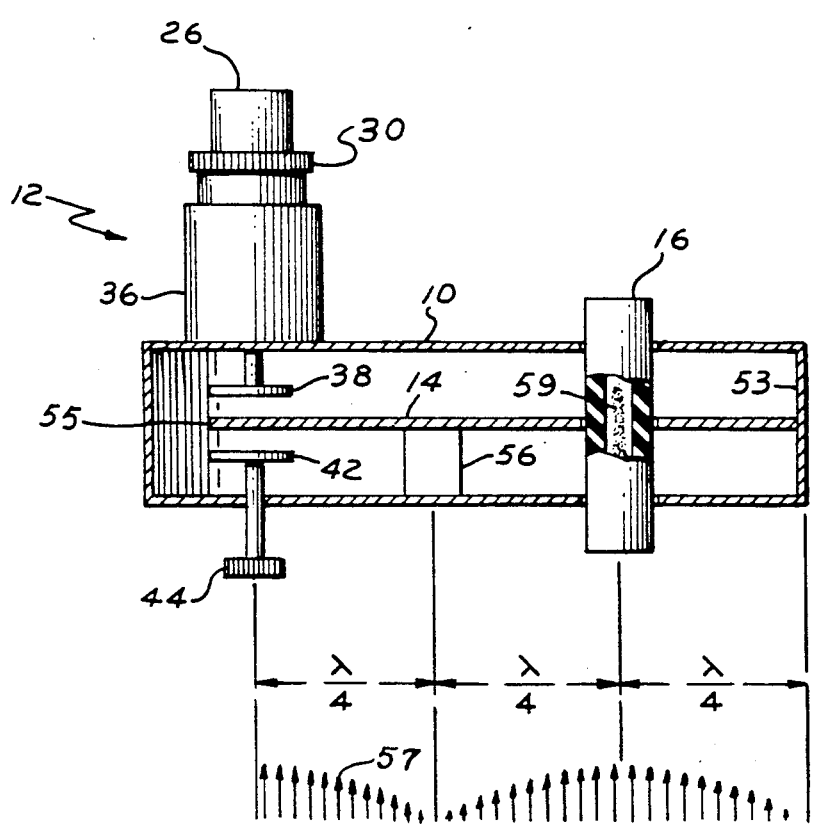
FIG. 2 is a side elevational view of the microwave strip-line and screen cavity of FIG. 1.
Figure 3:
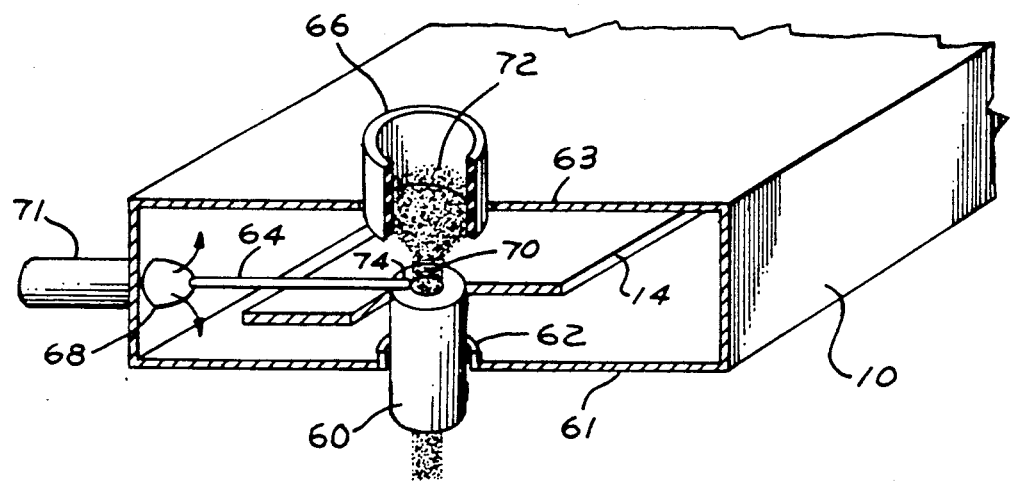
FIG. 3 is a perspective view illustrating a modified embodiment of the plasma tube for use in the cavity.
Figure 4:
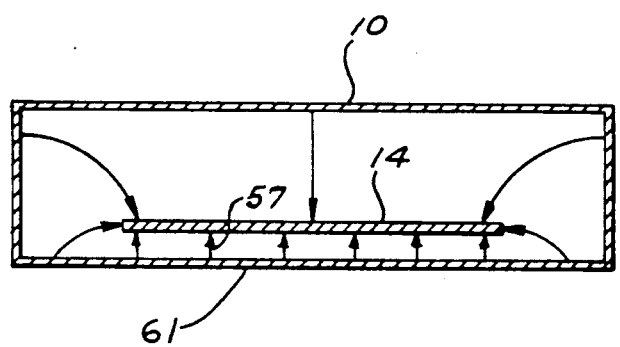
FIGS. 4 and 5 are schematic cross-sectional representations of modifications of the strip-line cavity.
Figure 5:
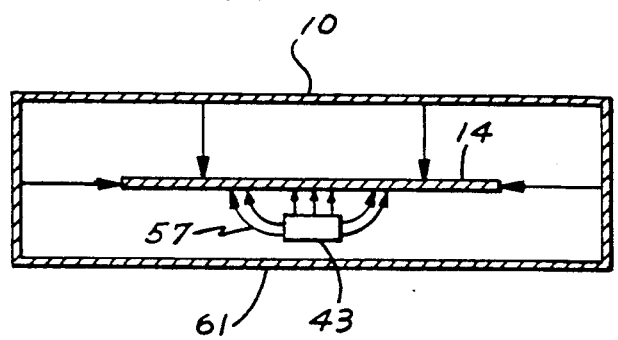

The strip-line 14 can be composed of suitable sheet metal or aluminum which may be centered within the conduit 10 (FIG. 3) or as depicted in FIG. 4, may be displaced vertically from the center, either upward or downward within the conduit 10. When so positioned, the electric field 57 (indicated by arrows) will be concentrated between the strip-line and the adjacent wall 61 of the conduit. Another modification shown in FIG. 5, is to utilize an electrically conductive material 43 disposed to concentrate the electric field 57 at a particular position along the strip-line 14. To provide various levels of impedance for a given thickness a of the strip-line 14 (FIG. 1) and electrical length thereof, different widths c of the strip-line may be employed. FIG. 2 depicts free end 55 of strip-line 14 disposed between and parallel to the antenna 38 and the tuning plate 42. At its opposite end, the strip-line 14 is affixed to the "closed" end 53 of the rectangular conduit 10. The effective electrical length of stripe-line 14, as represented by the electric field amplitude curve 57, is three-quarters the wavelength of the microwave energy. A dielectric support member 56 may be disposed on the underside of the strip-line 14 at a location one-quarter wavelength from the coupling device 12. As a result, the support 56 will have minimal attenuating affect on the propagation of the microwave energy by the stripe-line, since its location corresponds to a point along the strip-line of zero amplitude of the microwave energy 57.

The discharge tube 16 is composed of a non-metallic dielectric material, such as alumina or quartz, which is capable of operation in high temperature conditions. The longitudinal axis of the discharge tube 16 is oriented perpendicular to the major surface areas of the strip-line 14 and generally parallel to the coupling device 12. Discharge tubes of different inner and outer diameters may be used for producing plasmas of different size. For example, to obtain a relatively small plasma, a discharge tube having an internal diameter (ID) of 1 mm and an outer diameter (OD) of 6 mm may be used.

In operation, microwave energy is propagated along the strip-line from the plate antenna 38 to the discharge tube 16. Adjustments for resonant coupling can be made by varying the distance between plate antenna 38 and the strip-line by adjusting knob 30 and by adjusting knob 44 of the capacitive tuner, as hereinbefore discussed. In making these adjustments, the forward microwave power resonated along the strip-line 14 is maximized while the reflected power from the strip-line is minimized, thus $$\frac{P_f - P_r}{P_r}$$

should be relatively large for efficient transfer of microwave energy. An ionizable gas, such as argon or helium, which may be excited to a plasma state, is introduced into the discharge tube 16 at atmospheric pressure. Microwave energy is transferred to the discharge tube by the strip-line 14 and the electrical field of the microwave energy ionizes the gas and a plasma 59 is generated.

As shown in FIG. 3, a modification to the discharge tube 16 includes a laterally extending feeder tube 64, a processing tube 66, a capillary tube 60 and a concentrator 62. The capillary tube 60 extends perpendicularly through both the lower wall 61 of conduit 10 and the strip-line 14. The capillary tube 60 is surrounded by concentrator 62 which is mounted adjacent the lower wall 61 of conduit 10. The concentrator 62 is in the shape of a cylindrical collar and is made of any suitably conductive material. The concentrator functions to increase the density of the electric field surrounding the capillary tube 60. The laterally extending tube 64 is dielectric in composition and is used to introduce a test substance into the plasma. The processing tube 66 is disposed in axial alignment directly above the capillary tube 60 and extends perpendicularly through the upper wall 63 of the conduit 10. The processing tube 66 is substantially larger in inner diameter and may also be substantially larger in outer diameter than the capillary tube 60 and the axial spacing between the two tubes is selected to a predetermined value for each gas and liquid or combination thereof. Additional ionizable gas 68 is supplied into the rectangular conduit by a supply tube 71 which opens through the sidewall at the same location as tube 64 and the major portion of this gas escapes through processing tube 66.

This modification has special utility in direct liquid introduction and in liquid chromatography where a pilot plasma 70 is formed in the capillary tube 60 and the additional gas 68 forms an enlarged plasma 72 in the processing tube 66. A test substance 74 may be introduced by the feeder tube 64 to the enlarged plasma 72. If, for any reason, the enlarged plasma 72 should be extinguished by the test substance 74, the pilot plasma 70 will automatically restart the enlarged plasma when the test substance is removed. The following examples are illustrative of the power requirements for forming atmospheric pressure plasmas at particular frequencies using argon and helium gases, a capillary tube of 1 mm ID and a 6 mm OD and a processing tube of 4 mm ID and 7 mm OD.

| GAS | MINIMUM POWER TO MAINTAIN PLASMA IN CAPILLARY TUBE | OPERATING POWER FOR MAINTAINING PLASMAS | TOTAL POWER | FREQUENCY |
| --- | --- | --- | --- | --- |
| Argon | 3-5W | 25W-85W | 40W-100W | 2.45 GHZ |
| Helium | 15W | 25W-85W | 40W-100W | 2.45 GHZ |

Having thus described my invention, what is claimed is:

1. A cavity for propagating microwave energy comprising a conduit of rectangular cross-section, a stripline disposed within said conduit and having a free end and another end attached to the rectangular conduit, an energy coupling device for transferring microwave energy onto the free end portion of said strip-line and a discharge tube which extends through an opening in the strip-line and being located at a distance of one-half wavelength of the microwave energy from the coupling device.

2. A cavity for propagating microwave energy, as set forth in claim 1, wherein the end of said strip-line attached to said conduit is one-quarter wavelength from the location of said discharge tube.

3. A cavity for propagating microwave energy, as set forth in claim 1, wherein said coupling device comprises a generally circular plate antenna mounted parallel to the major surfaces of said strip-line and an adjustment device for varying the spacing between the plate antenna and the strip-line.

4. A cavity for propagating microwave energy, as set forth in claim 1, wherein said coupling device includes a capacitive element for tuning the impedance of the coupling device to the resonant frequency of said stripline.

5. A cavity for propagating microwave energy, as set forth in claim 1, wherein said discharge tube includes a capillary tube and a processing tube disposed in axial alignment above the capillary tube, a concentrator disposed below the strip-line and surrounding the capillary tube, a laterally disposed feeder tube for introducing a test substance normal to the axial orientation of the capillary tube and the discharge tube.

6. A cavity for propagating microwave energy, as set forth in claim 5, wherein an additional supply tube is provided for supplying additional ionizable gas to said discharge tube.

* * * * *